United States Patent [19]

Ohms et al.

[11] Patent Number: 5,054,193
[45] Date of Patent: Oct. 8, 1991

[54] PRINTED CIRCUIT BOARD FIXTURE AND A METHOD OF ASSEMBLING A PRINTED CIRCUIT BOARD

[75] Inventors: Kurt Ohms, Los Altos, Calif.; Juan Jimenez, Beradale, Wash.

[73] Assignee: Hewlett-Packard Company, Palo Alto, Calif.

[21] Appl. No.: 399,653

[22] Filed: Aug. 28, 1989

[51] Int. Cl.⁵ ............................................. H05K 3/34
[52] U.S. Cl. .................................. 29/840; 29/832; 29/760; 269/7; 269/21; 269/270
[58] Field of Search ............ 29/832, 833, 834, 835, 29/836, 840, 760; 269/7, 21, 266, 267

[56] References Cited

U.S. PATENT DOCUMENTS

| | | | |
|---|---|---|---|
| 3,395,439 | 8/1968 | Palesi et al. | 29/760 |
| 4,768,286 | 9/1988 | Ketcham | 29/841 |
| 4,916,807 | 4/1990 | Wiese | 29/840 |

FOREIGN PATENT DOCUMENTS

| | | | |
|---|---|---|---|
| 3414552 | 10/1985 | Fed. Rep. of Germany | 29/836 |
| 54341 | 3/1982 | Japan | 269/21 |

Primary Examiner—P. W. Echols
Attorney, Agent, or Firm—Herbert R. Schulze

[57] ABSTRACT

A fixture for supporting a double-sided surface mount printed circuit board during installation of components on a second side of the board. After components have been installed on one side of the board, a slab of controllably shapable material such as thermally compliant foam is shaped by pressing it against the board under heat and pressure to conform to the shape of the board and its components. When the material cools, it is used to support the board during the installation of components on the other side. In an alternate embodiment, a viscous substance is used as the shapable material and is conformed to the shape of the board while the substance is being hardened. A board on which components are being installed may be held in place on the fixture by a vacuum which is supplied from a manifold through holes in the fixture to the board.

4 Claims, 5 Drawing Sheets

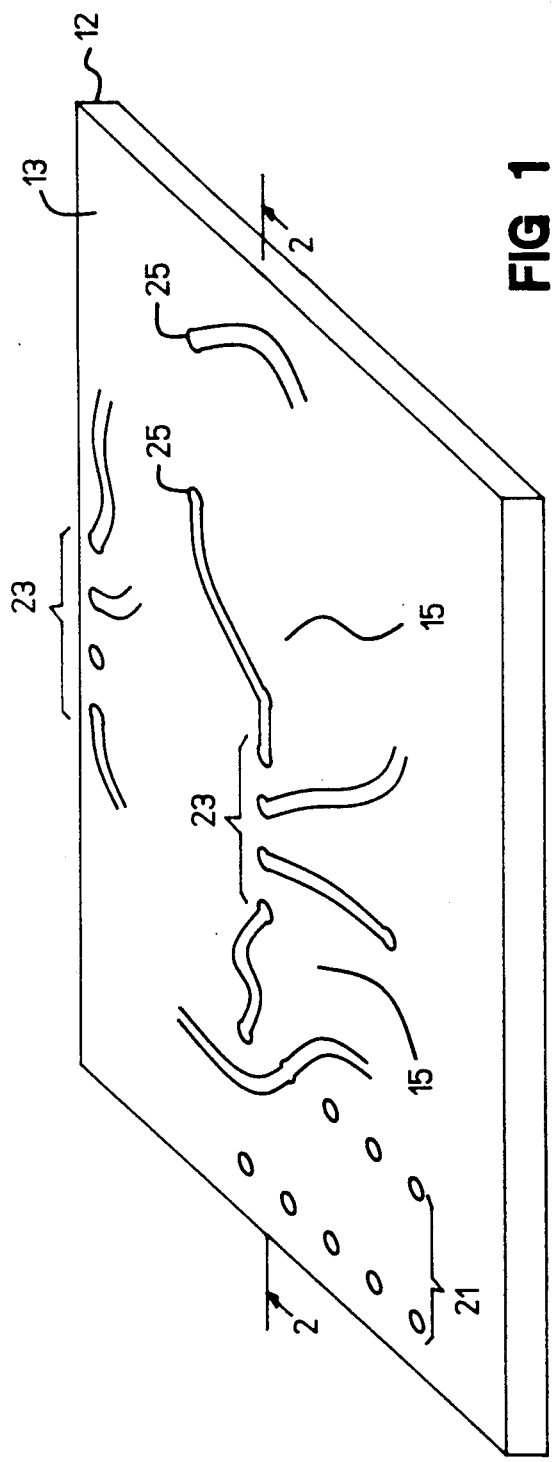
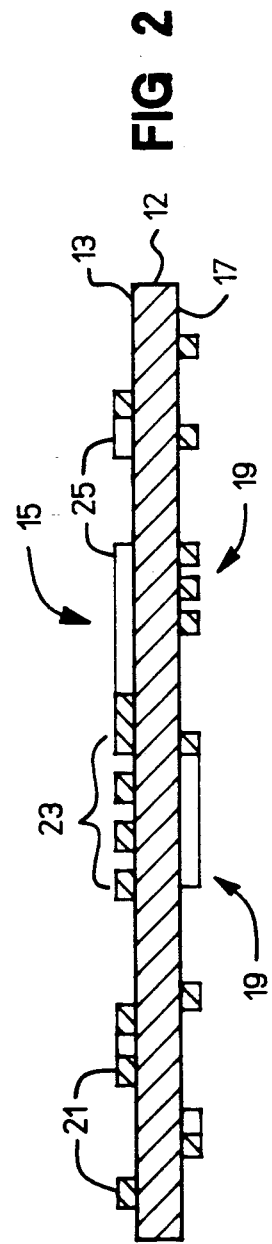
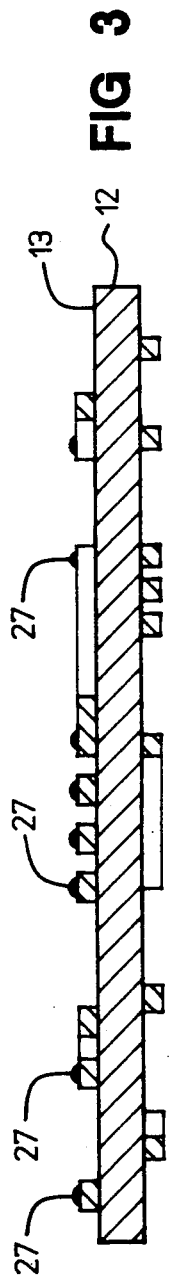

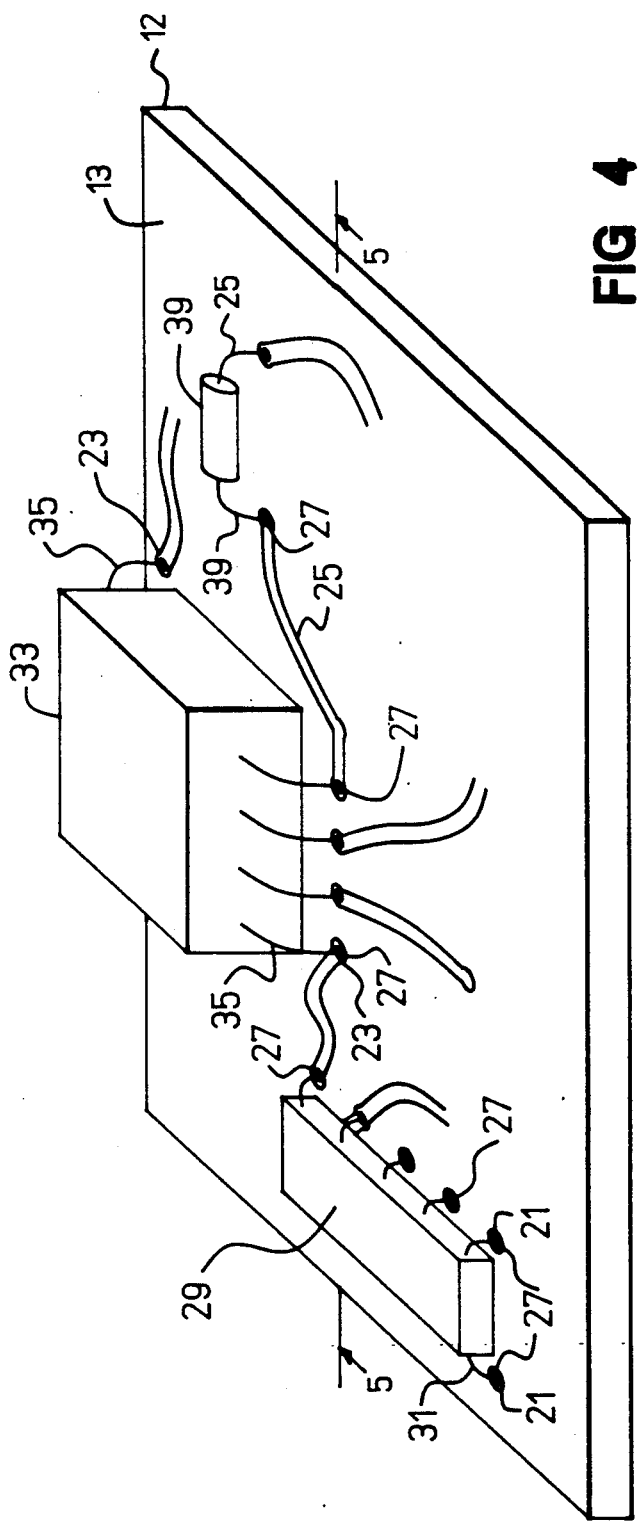
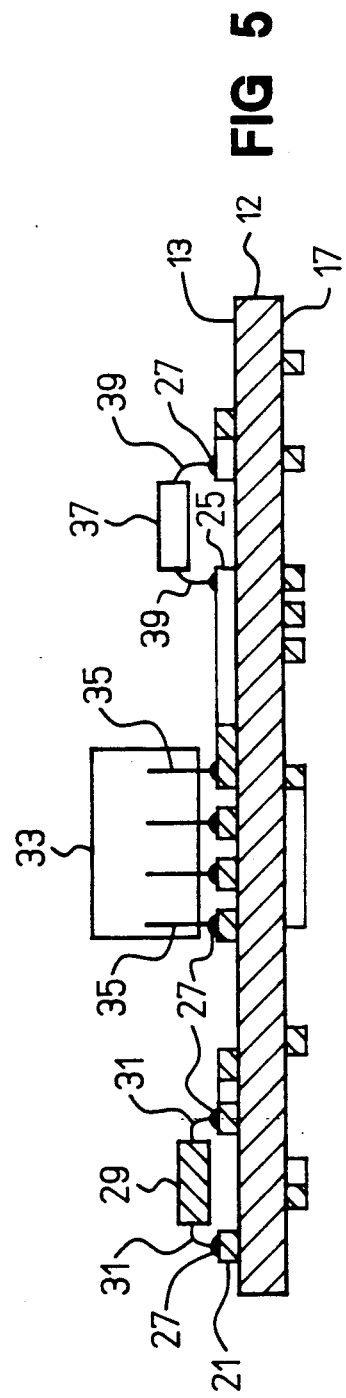

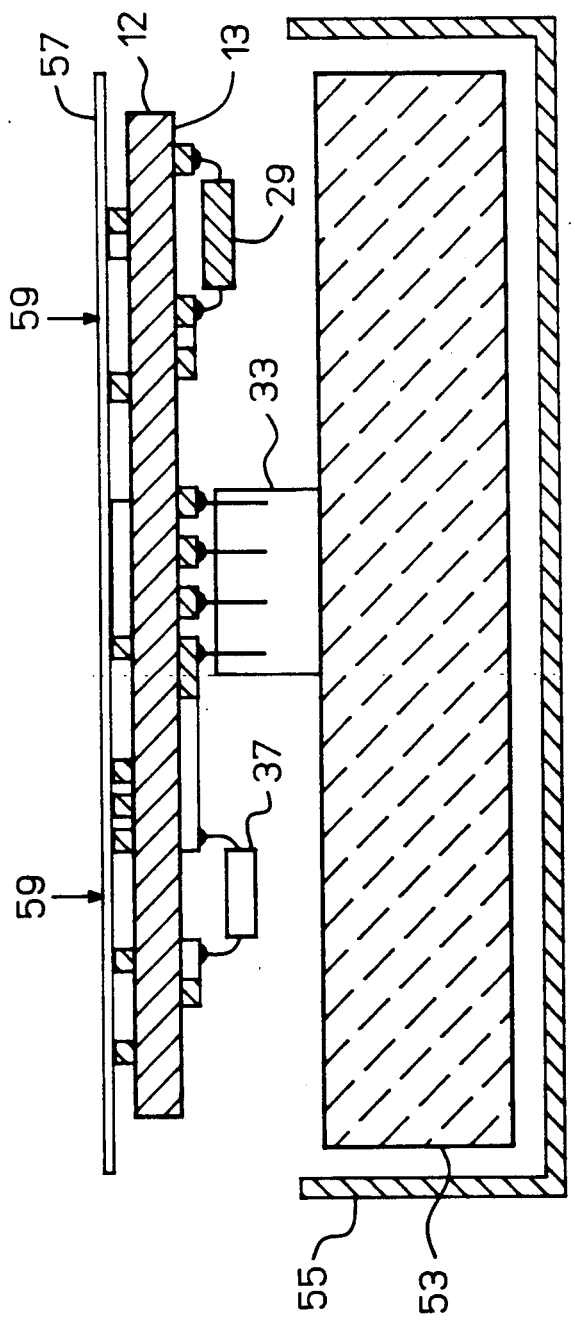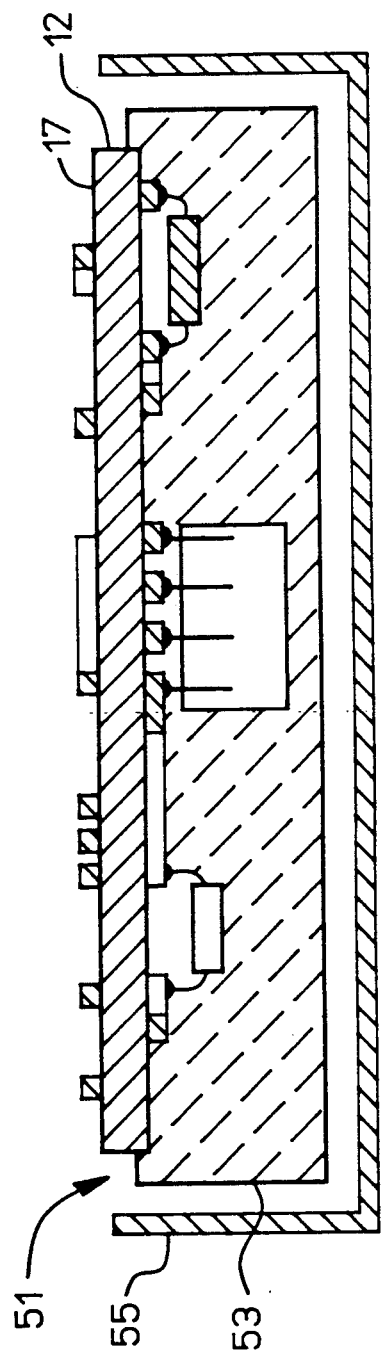

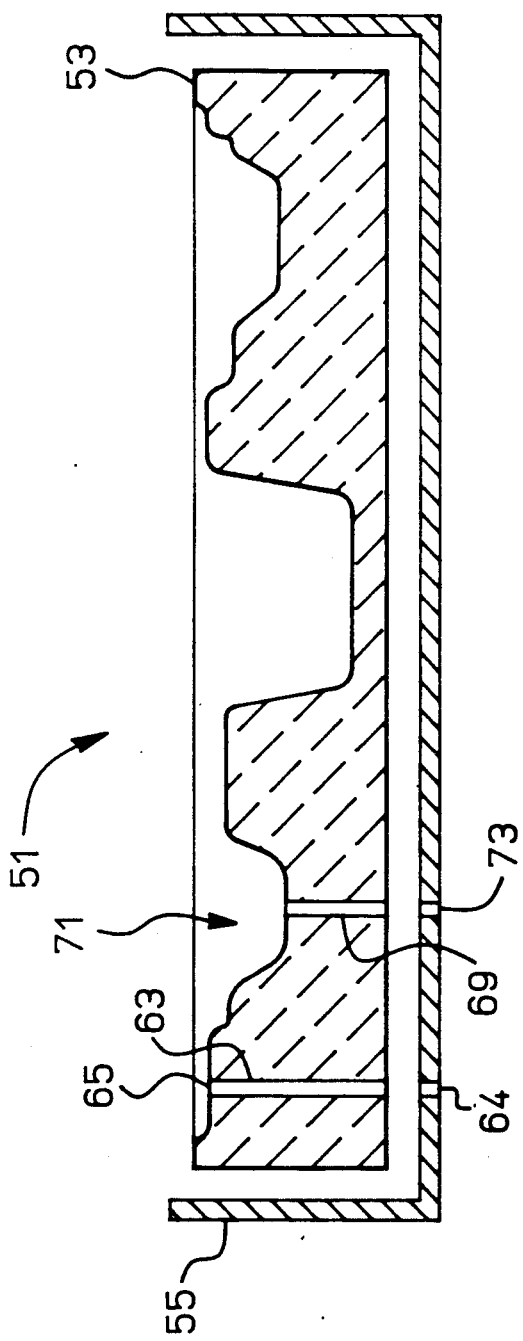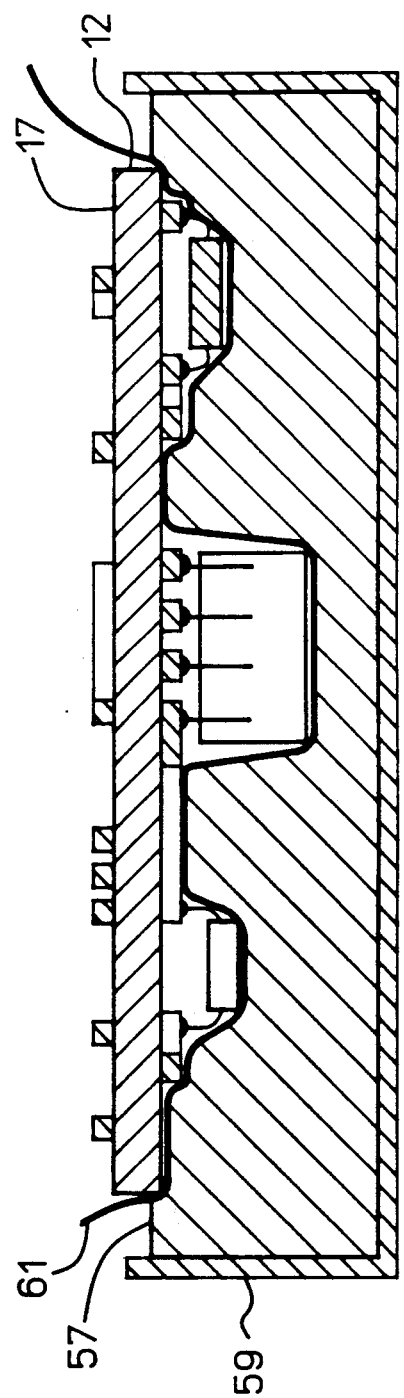

PRINTED CIRCUIT BOARD FIXTURE AND A METHOD OF ASSEMBLING A PRINTED CIRCUIT BOARD

BACKGROUND OF THE INVENTION

The present invention relates generally to tooling for the assembly of electronic devices and more particularly to a fixture for supporting a printed circuit board and a method of fabricating and utilizing the fixture during the mounting of components on such a board.

Printed circuit boards are used to support and interconnect components such as integrated circuits ("ICs"), resistors, capacitors and the like. There has been a trend for ICs to grow more complex, for the physical sizes of ICs and of other components to shrink, and for the density of components to increase. In order to adequately support and interconnect these very small, highly complex components on printed circuit boards, surface mount printed circuit board techniques have been developed and are coming into widespread use.

Installing components on a printed circuit board by means of surface mount techniques differs from conventional mounting in that the leads of the components are not inserted into holes in the board. Instead, the leads are soldered to solder pads on the surface of the board (the solder pads consist of exposed areas of the printed wiring on the board).

More particularly, surface mounting includes applying a solder paste to all the solder pads on the board, for example by a stencil screen process; placing all the components on the board with their leads in proper alignment with the pads; and applying heat to the resulting assembly, for example by baking it in an oven, to reflow (melt) the solder paste and thereby fix the leads of the components to their respective solder pads.

In order to fit as many components as possible onto a circuit board and thereby minimize the number of boards which must be used to manufacture a complete electronic unit, many circuit boards are now being designed for double-sided component mounting. To install components on such a board requires carrying out the above mounting sequence twice, once to install components on one side of the board and again to install the remaining components on the other side of the board.

The surface of the board must remain flat, and the board itself must be held immobile, during the application of the solder paste and the positioning of the components. The materials of which circuit boards are made are not inherently rigid enough for this purpose, and hence the board must be supported beneath substantially its entire area during component installation. This is easily accomplished during the installation of components on the first side of the board simply by resting the board on a flat work surface such as a rigid metal plate. However, this method does not work when installing components on the second side of the board because the components on the first side protrude and get in the way.

A suitable rigid support can be made by machining a set of depressions into a block of metal, one depression for each component, the depressions being laid out in a pattern which corresponds with the pattern of the components on the first side of the board. In general the components are not all of the same size and hence each depression must be machined to a different size according to the particular component which that depression is to accommodate. In addition, small variations in component placement from one board to another during a production run can result in a misfit between a board and the supporting block.

To assemble a board by means of such a machined support block, the components are installed on the first side of the board as described above; then the board is inverted and placed on the machined support with the components resting in their corresponding depressions; then the solder paste is applied to the second side of the board, the remaining components are positioned, and the assembly is heated to fix the component leads to their solder pads on the second side of the board.

Each different circuit layout requires a different supporting block. Moreover, any change in the physical positioning of components on a circuit board requires that the block be re-machined or in some instances that a new block be prepared. A new block may even be needed just to accommodate a change in the dimensions of a single component. Machining and re-machining these support blocks is an expensive and time-consuming process (the assignee of the present application finds that the cost of fabricating such a block averages nearly $1500) and has been a serious problem in the assembly of double-sided printed circuit boards. The problem is especially acute with respect to the assembly of prototype circuit boards and relatively small production runs.

It will be apparent from the foregoing that there is a need for a simple, economical means of supporting a printed circuit board during the installation of components thereon.

SUMMARY OF THE INVENTION

The present invention provides a fixture of controllably shapable material which is shaped to conform to the shape of a printed circuit board and any components installed on one side of the board. After the fixture has been shaped and has become sufficiently rigid, it is used to support the board during the mounting of components on the other side.

A method of assembling a printed circuit board according to the invention includes installing components on a first side of the board; shaping a slab of controllably shapable material to conform to the shape of the board and the components on the board; and using the shaped slab of material to support the board while installing more components on the other side of the board.

In a preferred embodiment, the slab of material comprises thermally compliant foam. The foam is shaped by pressing it against the circuit board and applying sufficient heat to soften the foam and conform it to the shape of the board and the components installed on the board. As the foam cools, it retains its new shape and becomes sufficiently rigid to support the board.

In an alternate embodiment, a viscous substance is used as the shapable material. The board and components are preferably covered with a membrane and pressed into the substance while the substance hardens, for example by chemical action.

Installing the components on the circuit board typically includes applying solder paste to solder pads on the board, placing components on the board with their leads properly aligned with the solder pads, and applying heat to reflow the solder paste and fix the leads of the components to their respective solder pads.

The slab of material is preferably placed in a rigid tray or the like, both to provide a rigid backing during the shaping of the material and to provide further rigidity after the material has been shaped. The material is preferably electrically conductive to minimize any risk of static damage to sensitive components.

Once the material has been shaped it can be used repeatedly during a printed circuit board production run to support each board in sequence while components are being installed on the second side of the board. The material preferably retains enough elasticity to accommodate itself to minor variations in component location from one board to another.

In one embodiment an opening extends through the slab for communicating a vacuum from a vacuum source to a circuit board resting on the slab, the vacuum being effective to hold the board immobile on the slab while components are being installed on the second side of the board. Alternatively, a porous slab may be used together with means for communicating the vacuum to the slab and through the pores of the slab to the board to hold the board in place.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 1 is a perspective view of a printed circuit board prior to the installation of any components thereon and showing printed wiring and solder pads on a first side of the board;

FIG. 2 is a sectional view taken along the line 2—2 of FIG. 1 and showing printed wiring and solder pads on both sides of the board;

FIG. 3 is similar to FIG. 2, showing the board after solder paste has been applied to the solder pads on the first side of the board;

FIG. 4 shows the board of FIGS. 1 through 3 after components have been installed on the first side;

FIG. 5 is a sectional view taken along the line 5—5 of FIG. 4;

FIG. 9 shows the board of FIG. 6 being compressed against the material of FIG. 8 and heat being applied;

FIG. 10 shows the material of FIG. 8 after being conformed to the shape of the board of FIG. 6 with the board in position;

FIG. 11 shows the completed fixture after removal of the circuit board; and

FIG. 12 shows an alternate embodiment in which a viscous substance serves as the controllably shapable material and a membrane protects the board and its components during the shaping of the material.

DESCRIPTION OF THE PREFERRED EMBODIMENT

Figure 6:
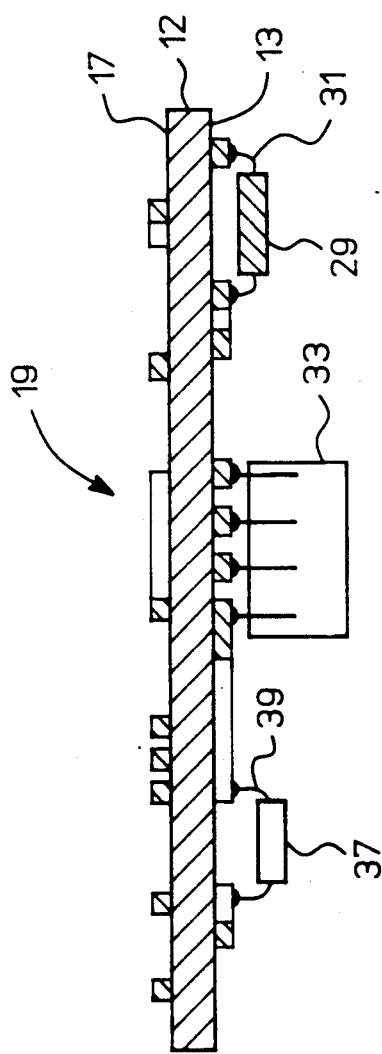
FIG. 6 shows the board of FIG. 5 inverted for installation of components on its second side.

As shown in the drawings for purposes of illustration, the invention is embodied in a novel fixture for supporting a printed circuit board during installation of components. A circuit board must remain flat during the installation of components, but after components have been installed on one side of a dual-sided circuit board it has been difficult to keep the board flat while working on the other side. Rigid blocks of metal have been machined to support such boards, but the block must be re-machined, or a new block must be machined, each time there is any change in component size or layout, and the machining of the blocks is expensive and time-consuming.

In accordance with the invention, a support fixture is made by shaping a slab of controllably shapable material to conform to the shape of the circuit board and any components installed on one side. This procedure is simple, quick and economical, and once the fixture has been made it can be reused as often as desired during a production run. Because the fixture is made using an actual board from the production run as a pattern, no advance pattern design is required.

The process of installing components on a first side of a printed circuit board by means of surface mount techniques is depicted in FIGS. 1 through 5. A printed circuit board 12 has a first side 13 with printed wiring generally designated 15 and a second side 17 with printed wiring generally designated 19 (in the drawings the thickness of the printed wiring has been exaggerated for clarity). The wiring 15 includes a first plurality of solder pads 21 for receiving a first component, a second plurality of solder pads 23 for receiving a second component, and a third plurality of solder pads 25 for receiving a third component. Similarly, the wiring 19' includes solder pads (not designated) for receiving components on the second side 17 of the board 12.

During the installation of components on the first side 13, the board 12 is supported on a flat rigid work surface (not shown). Solder paste 27 is applied to the solder pads 21, 23 and 25, for example by a stencil screen process (it will be apparent to those skilled in the art that the paste 27 and the pads 21, 23 and 25 are not drawn to scale in the drawings, the paste in actuality being much thicker than the pads). Then the components are placed in their respective positions on the board. For example, an IC 29 is positioned with its leads 31 in alignment with and resting on respective ones of the solder pads 21, an IC 33 is positioned with its leads 35 in alignment with and resting on respective ones of the solder pads 23, and a diode 37 is positioned with its leads 39 in alignment with and resting on respective ones of the solder pads 25.

Then the entire assembly (the board 11 and the components 29, 33 and 37) is heated, for example by baking it in an oven (not shown) just enough to reflow (melt) the solder paste and thereby fix the leads to their respective solder pads.

To install components on the second side 17 of the board 12, the board is inverted, as shown in FIG. 6, but once inverted it cannot be supported on a flat work surface because the components 29, 33 and 37 protrude. Moreover, the various components on a typical circuit board are of different thicknesses and hence they protrude to varying distances from the surface 13.

Figure 7:
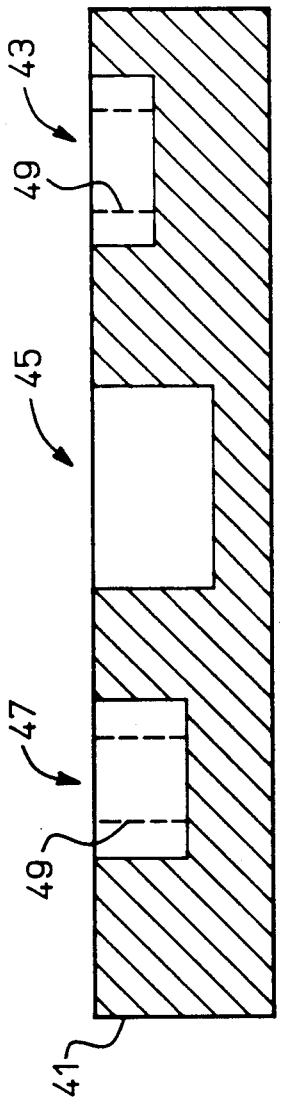
FIG. 7 (prior art) shows a machined block of the kind which has been used in the past to support a board during installation of components on a second side.
Figure 8:
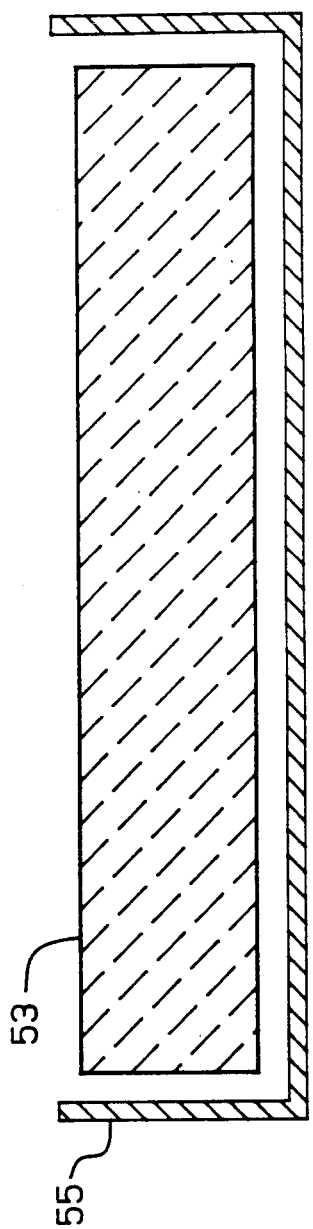
FIG. 8 shows a slab of controllably shapable material in a rigid tray.

In the past, a rigid metal block such as the block 41 shown in FIG. 7 has been used to support a circuit board during the installation of components on the second side. The block 41 has a first depression 43 sized to receive the IC 29, a second depression 45 sized to receive the IC 33, and a third depression 47 sized to receive the diode 37. In machining the depressions, care must be taken to make each depression large enough to accommodate the leads of its respective component as well as the body of the component, as indicated by dotted lines 49 which show the dimensions of the bodies of the components 29 and 37 in comparison with the dimesions of the depressions 43 and 47, respectively. The block 41 is costly and time-consuming to fabricate, and the need for such a supporting block has been a significant problem in the assembly of double-sided surface mount printed circuit boards.

According to the present invention, a fixture 51 for supporting a printed circuit board such as the board 12 with the installed components 29, 33 and 37 comprises a slab 53 of controllably shapable material shaped to conform to the shape of the board and the components installed on the first side, as shown in FIGS. 8 through 11. The fixture 51 is sufficiently rigid to support substantially all portions of the first side 13 of the circuit board 12 and the components 29, 33 and 37 installed thereon during installation of components on the second side 17.

In a preferred embodiment the fixture 51 includes a rigid tray 55 which contains the slab 53 of material and provides additional support.

The shapable material is preferably electrically conductive to minimize any risk of static electricity damaging sensitive components.

A method of assembling the printed circuit board 12 according to the invention includes the steps of installing components such as the components 29, 33 and 37 on the first side 13 of the board 12, for example according to the procedure as described above; shaping the slab 53 of material, for example by means of heat and pressure as described in more detail below, to conform to the shape of the first side 13 of the board 12 and the components installed thereon; and supporting the circuit board 12 with the slab 53 of material while installing the desired components on the second side 17 of the board 12.

The components are installed on the second side 17 in a manner similar to the procedure as described above for installing the components on the first side 13—specifically, solder paste is applied to the solder pads, the components are placed on the board with their leads on the solder pads, and heat is applied to fix the component leads to the solder pads.

The slab 53 of shapable material preferably comprises a thermally compliant foam. A foam which has given satisfactory results is marketed by Sentinel Foam Products of Hyannis, Mass. under the name "conductive crosslinked polyethylene foam," type number "CXP-3R". The shaping of such thermally compliant material takes place under heat and pressure. As shown in FIG. 9, the board 12 is placed on the slab 53 and the two are compressed together. This compressing may be done, for example, by placing a plate 57 on top of the board 12 and pressing down as indicated by arrows 59. The pressure may be generated, for example, by spring clamps or the like or by placing weights on the plate 57.

The heat which is used to conform the slab 53 of material to the shape of the board is preferably applied by placing the board and the material in an oven and applying the heat until the material is soft enough to conform to the shape of the board, as best shown in FIG. 10. Then the heat is removed and the material is cooled with the board in place. Once the material has cooled, it retains its new shape. The board can then be removed, as shown in FIG. 11, or it can be left in place if it is desired to proceed at once with installation of components on the second side of the board. The completed fixture 51 can be used to support the same board or a succession of boards having the same component layout during the installation of components on the second sides of the boards.

An advantage of the thermally compliant foam is that after it has cooled it retains enough compressibility to conform to minor variations in component placement from one board to another during a production run without permanently changing its shape, but it remains sufficiently rigid to adequately support the board during the application of solder paste and the placement of components on the second side.

In an alternate embodiment as depicted in FIG. 12, a viscous substance 57 such as resin or ultraviolet curable material is used as the controllably shapable material. The substance 57 is contained in a container 59 of suitable dimensions. A hardening process is commenced, for example by mixing a curing agent or a catalyst (not shown) with the substance or by exposing it to ultraviolet radiation, and the board 12 and components are pressed into the substance and kept there until the substance has hardened sufficiently to retain the shape of the board and the components.

The board and components are preferably protected by a flexible membrane 61 during this process. The thickness of the membrane 61 causes the depressions in the substance to be slightly larger than the dimensions of their corresponding components so that slight variations in component placement on other similar boards can be accommodated by the finished fixture.

It is sometimes necessary for a circuit board to be held immobile on the slab during the application of solder paste or the placing of components. This can be accomplished, for example, by vacuum. In one embodiment an opening 63 extends through the slab 53 to an adjoining opening 64 which extends through the tray 55 as shown in FIG. 11. The opening 64 is adapted to receive a vacuum from a vacuum source (not shown), for example through a manifold (not shown) which supports the tray 55. The vacuum is communicated through the openings 64 and 63 to an upper extremity 65 of the opening 63 and thence to a circuit board when the board is resting on the slab 53.

A plurality of openings may be used if desired, and some of the openings such as an opening 69 may be located in a depression 71 in the slab 53 so as to communicate the vacuum to a component which has been installed on the first side of the board. An opening 73 in the tray 55 is used to communicate the vacuum from the vacuum source to the opening 69.

In another embodiment (not shown) the slab may be fabricated of porous material and the vacuum may be communicated from the manifold through the slab to hold the board in position. The slab is preferably contained in a tray such as the tray 55 and the vacuum is communicated to the slab through openings such as the openings 64 and 73 in the tray 55.

From the foregoing it will be appreciated that the present invention provides a simple and economical fixture for supporting printed circuit boards during the installation of components. The fixture can be made as a step in the installation of components on a prototype board and then used to support that same board without removing the board from the fixture during subsequent steps in the installation of components on that board. The fixture can also be used during a production run to support a succession of boards. No advance layout, measurement of component dimensions or calculation of relative component and lead locations need be done because an assembled board is used as the pattern; for this reason a fixture according to the invention can easily be fabricated in about an hour as compared to eight or more hours of work to lay out and machine a rigid block.

Although a specific embodiment of the invention has been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

We claim:

1. A fixture for supporting a printed circuit board, the fixture comprising a slab of controllably shapable thermally compliant foam shaped to conform to the shape of the board and any components installed on one side thereof, the fixture being sufficiently rigid to support substantially all portions of said side of the circuit board and the components installed thereon and to prevent deformation of the fixture and any resulting flexure of the board during installation of components on the other side of the board.

2. A method of assembling a printed circuit board, the method comprising installing components on a first side of the board, shaping a controllably shapable thermally compliant material to conform to the shape of the board and the components installed thereon by pressing the board against the material and applying heat to conform the material to the shape of the board and the components on the board, the material having sufficient rigidity after the shaping to prevent deformation of the material and any resulting flexure of the board when the material is used to support the board during assembly of components on the other side of the board, and supporting the board with the shaped material while installing components on the other side of the board.

3. A method of assembling a printed circuit board, the method comprising installing components on a first side of the board, shaping a controllably shapable viscous substance to conform to the shape of the board and the components installed thereon, treating the substance to cause it to harden with sufficient rigidity after the shaping to prevent deformation of the substance and any resulting flexure of the board when the substance is used to support the board during assembly of components on the other side of the board, pressing the board into the substance before the substance has hardened, removing the board after the substance has hardened, and supporting the board with the shaped substance while installing components on the other side of the board.

4. A method according to claim 3 and further comprising covering the board and the components installed thereon with a flexible membrane before pressing the board into the substance.

* * * * *